United States Patent
Hsieh

(10) Patent No.: US 11,703,445 B2
(45) Date of Patent: Jul. 18, 2023

(54) BIOSENSOR WITH GRATING ARRAY

(71) Applicant: VisEra Technologies Company Limited, Hsin-Chu (TW)

(72) Inventor: Hsin-Yi Hsieh, Taoyuan (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 221 days.

(21) Appl. No.: 17/333,870

(22) Filed: May 28, 2021

(65) Prior Publication Data

US 2022/0381679 A1 Dec. 1, 2022

(51) Int. Cl.
*G02B 5/18* (2006.01)
*G01N 21/31* (2006.01)
*H01L 31/0232* (2014.01)

(52) U.S. Cl.
CPC ........... *G01N 21/31* (2013.01); *G02B 5/1823* (2013.01); *G02B 5/1866* (2013.01); *H01L 31/02327* (2013.01); *G01N 2201/0635* (2013.01)

(58) Field of Classification Search
CPC ...... G01J 1/0429; G01J 1/44; G01J 2001/446; G01N 21/6486; G01N 21/6454; G01N 2021/6471; G01N 21/645; G01N 21/64; G01N 21/01; G02B 5/3058; G02B 5/208; G02B 27/281
USPC .................. 356/300, 436, 456, 432; 250/225
See application file for complete search history.

(56) References Cited

U.S. PATENT DOCUMENTS

| | | | | |
|---|---|---|---|---|
| 2003/0203502 A1* | 10/2003 | Zenhausern | ......... | G01N 21/552 356/310 |
| 2010/0065726 A1* | 3/2010 | Zhong | ................ | G01N 21/7703 250/227.24 |
| 2010/0216143 A1* | 8/2010 | King | ................... | G01N 21/6428 435/6.13 |
| 2011/0266443 A1* | 11/2011 | Schimert | ................ | G01J 5/024 250/353 |
| 2015/0141267 A1* | 5/2015 | Rothberg | ............. | G01N 21/648 250/208.2 |
| 2017/0227465 A1* | 8/2017 | Hsieh | ................... | G02B 6/0053 |
| 2019/0383738 A1* | 12/2019 | Sato | ...................... | G01N 21/645 |

* cited by examiner

*Primary Examiner* — Isiaka O Akanbi
(74) *Attorney, Agent, or Firm* — Muncy, Geissler, Olds & Lowe, P.C.

(57) ABSTRACT

A biosensor is provided. The biosensor includes a plurality of sensor units. Each of the sensor units includes one or more photodiodes, a first aperture feature disposed above the photodiodes, an interlayer disposed on the first aperture feature, a second aperture feature disposed on the interlayer, and a waveguide disposed above the second aperture feature. The second aperture feature includes an upper grating element and the first aperture feature includes one or more lower grating elements, and a grating period of the upper grating element is less than or equal to a grating period of the one or more lower grating elements. A difference of the absolute values between a first polarizing angle of the upper and lower grating elements in one of the sensor units and a second polarizing angle of the upper and lower grating elements in adjacent one of the sensor units is 90°.

20 Claims, 8 Drawing Sheets

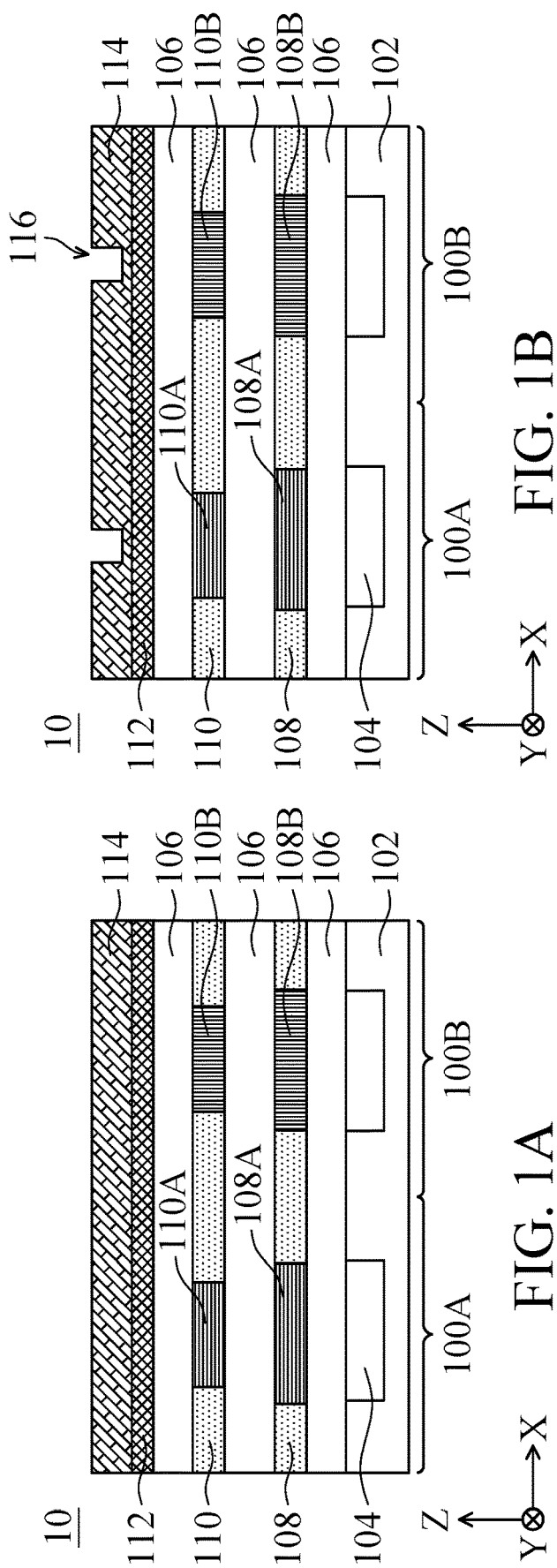
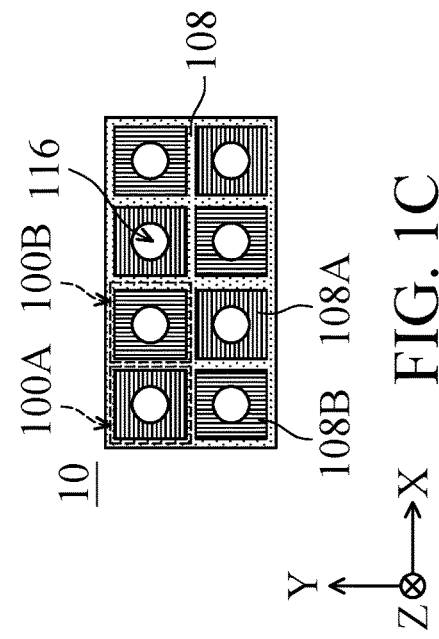

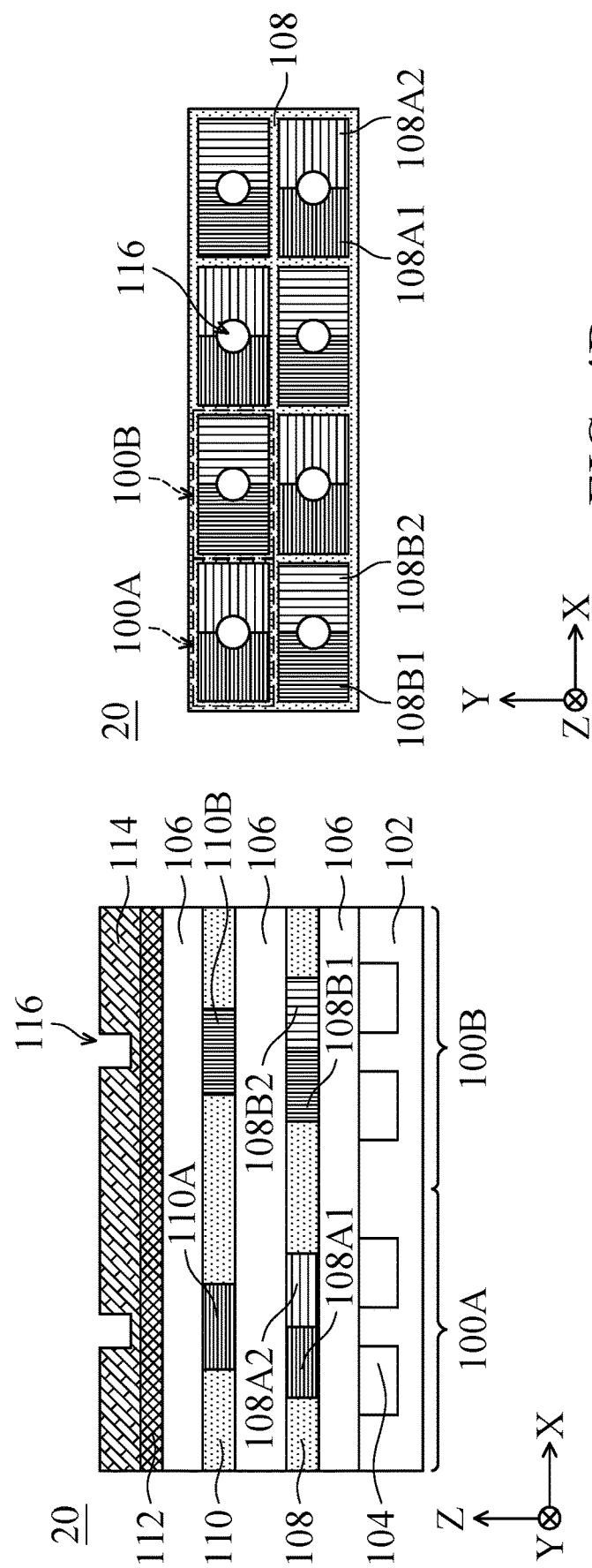

BIOSENSOR WITH GRATING ARRAY

BACKGROUND

Technical Field

The present disclosure relates in general to a biosensor, and in particular, it relates to a biosensor with a grating array.

Description of the Related Art

Recently, integrated sensing devices have been used for biological analysis. For this application, a biometric object or a bio-sample may be placed on a biosensor, and light reflected off from or emitted by the biometric object or the bio-sample may be directed to the photodiode of the biosensor. Therefore, the profile of the biometric object or biological properties of the bio-sample may be determined and identified for further analysis.

In the course of biosensor evolution, the array density of the biosensor has generally increased by reduction in space width or well pitch in order to pursue lower costs and achieve a higher throughput. However, such reductions in array size may cause crosstalk between neighboring wells during operation, and each individual fluorescent signal may not be detected precisely, leading to inaccurate analytical results.

Although existing biosensors have been adequate for their intended purposes, they have not been entirely satisfactory in all respects. Therefore, a novel biosensor with reduced crosstalk is still needed. In addition, it is also desirable to produce a biosensor that can precisely identify various biological features and bio-reactions.

SUMMARY

In accordance with some embodiments of the disclosure, a biosensor is provided. The biosensor includes a plurality of sensor units. Each of the sensor units includes one or more photodiodes, a first aperture feature disposed above the photodiodes, an interlayer disposed on the first aperture feature, a second aperture feature disposed on the interlayer, and a waveguide disposed above the second aperture feature. The second aperture feature includes an upper grating element and the first aperture feature includes one or more lower grating elements, and a grating period of the upper grating element is less than or equal to a grating period of the one or more lower grating elements. A difference of the absolute values between a first polarizing angle of the upper and lower grating elements in one of the sensor units and a second polarizing angle of the upper and lower grating elements in adjacent one of the sensor units is 90°.

In accordance with other embodiments of the disclosure, a biosensor is provided. The biosensor includes a plurality of sensor units. Each of the sensor units includes one or more photodiodes, a first aperture feature disposed above the photodiodes, an interlayer disposed on the first aperture feature and including an angle-sensitive filter, a second aperture feature disposed on the interlayer, and a waveguide disposed above the second aperture feature. The second aperture feature includes an upper grating element and the first aperture feature includes one or more lower grating elements, and a grating period of the upper grating element is less than or equal to a grating period of the one or more lower grating elements.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein:

FIGS. 1A-1B are cross-sectional diagrams of a biosensor in accordance with some embodiments of the disclosure.

FIG. 1C is a top-view diagram of a biosensor in accordance with some embodiments of the disclosure.

FIGS. 4A-4B illustrate a cross-sectional diagram and a top-view diagram of a biosensor in accordance with other embodiments of the disclosure, respectively.

DETAILED DESCRIPTION

Figure 2:
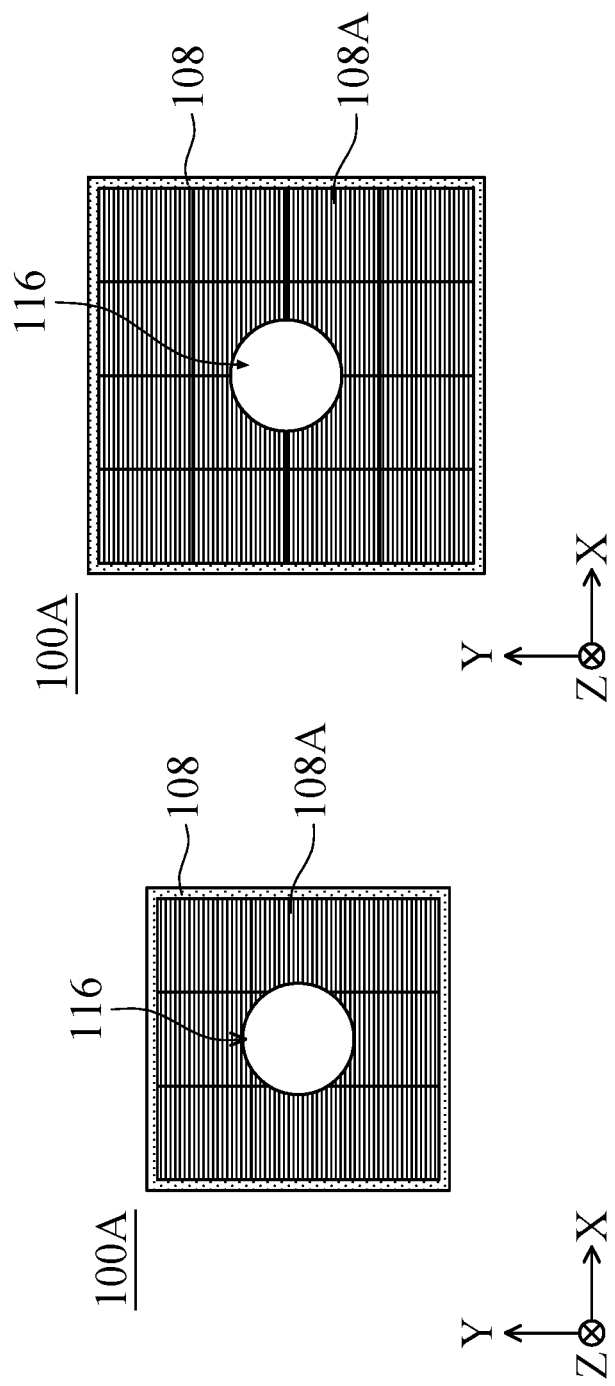
FIG. 2 illustrates top-view diagrams of a sensor unit in accordance with various embodiments of the disclosure.
Figure 3B:
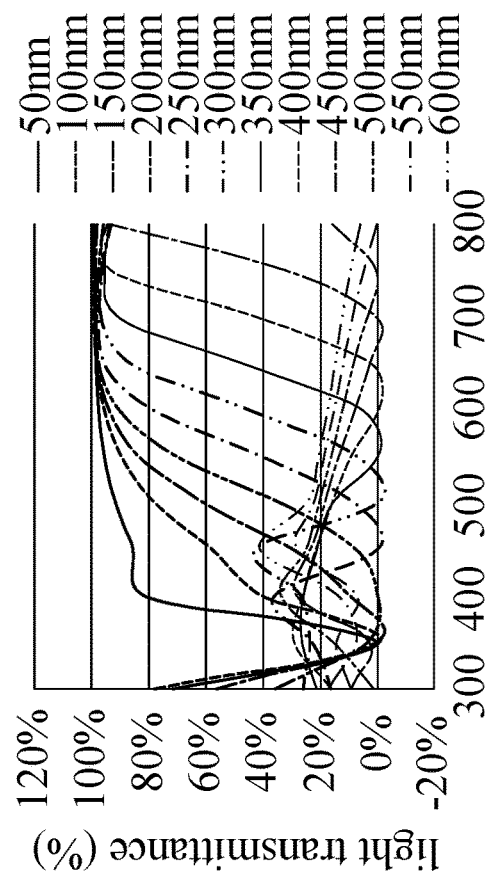
FIGS. 3A-3D are transmission spectrums of light passing through the upper or lower grating elements made of various materials and with various grating periods.
Figure 3D:
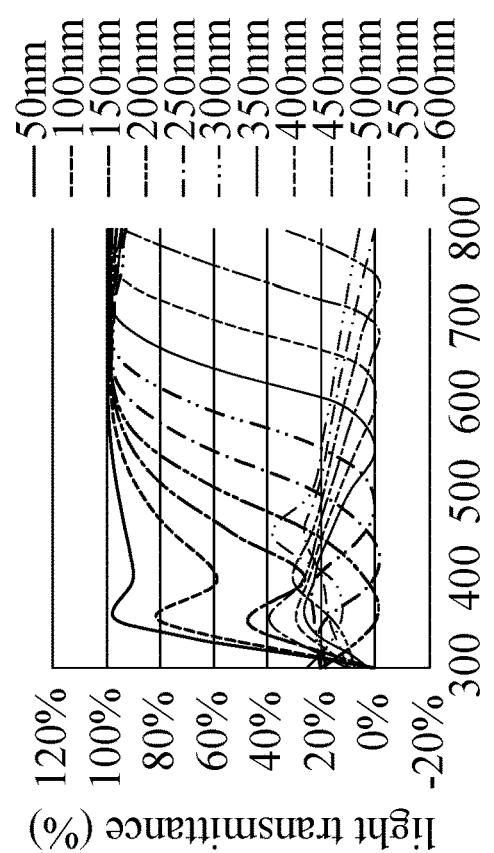
Figure 3A:
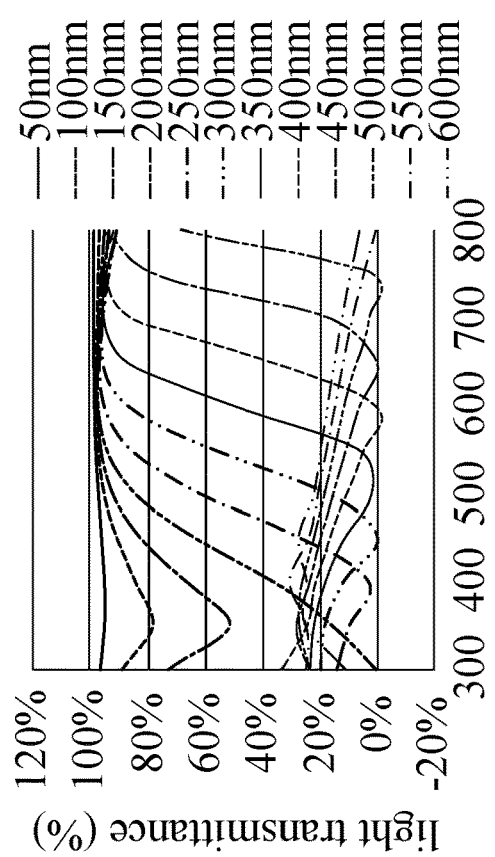
Figure 3C:
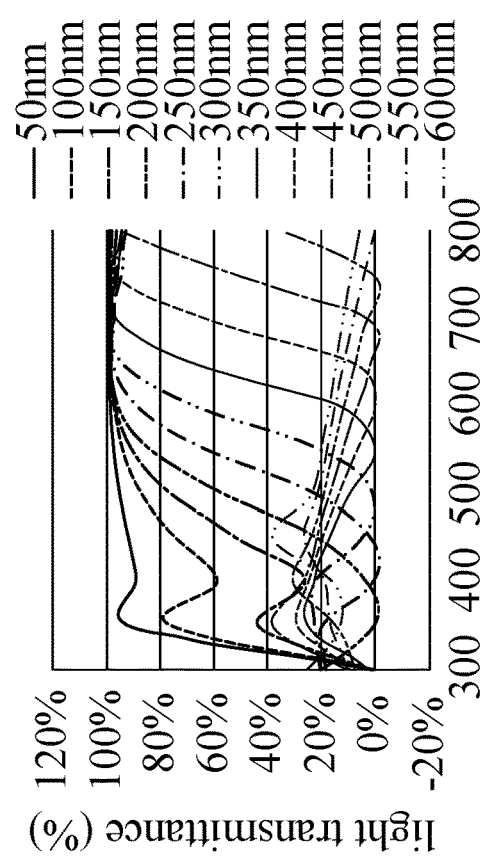

The biosensor of the present disclosure is described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the concept of the present disclosure may be embodied in various forms without being limited to those exemplary embodiments.

In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments. It should be understood that this description of the exemplary embodiments is intended to be read in connection with the accompanying drawings, which are to be considered part of the entire written description. The drawings are not drawn to scale. In addition, structures and devices are shown schematically in order to simplify the drawing.

In addition, the expressions "a layer is disposed above another layer", "a layer is disposed on another layer" and "a layer is disposed over another layer" may indicate that the layer is in direct contact with the other layer, or that the layer is not in direct contact with the other layer, there being one or more intermediate layers disposed between the layer and the other layer.

In addition, in this specification, relative expressions are used. For example, "lower" or "lower" are used to describe the position of one element relative to another. It should be appreciated that if a device is flipped upside down, an element that is "lower" will become an element that is "upper".

It should be understood that, although the terms first, second, third etc. may be used herein to describe various elements, components, regions, layers, portions and/or sections, these elements, components, regions, layers, portions and/or sections should not be limited by these terms. These terms are only used to distinguish one element, component, region, layer, portion or section from another element, component, region, layer or section. Thus, a first element, component, region, layer, portion or section discussed below could be termed a second element, component, region, layer, portion or section without departing from the teachings of the present disclosure.

The term "about" typically mean +/−10% of the stated value, more typically mean +/−5% of the stated value, more typically +/−3% of the stated value, more typically +/−2% of the stated value, more typically +/−1% of the stated value and even more typically +/−0.5% of the stated value. The stated value of the present disclosure is an approximate value. When there is no specific description, the stated value includes the meaning of "about" or "substantially".

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

In accordance with some embodiments of the disclosure, the biosensor includes a plurality of sensor units, and each sensor unit may include one or more lower grating elements in a first aperture feature and an upper grating element in a second aperture feature. The first polarizing angle of the upper and lower grating elements in one of the sensor units is different from the second polarizing angle of the upper and lower grating element in the adjacent sensor unit. Therefore, crosstalk between adjacent sensor units may be reduced. In addition, the grating period of the upper grating elements is less than or equal to the grating period of the lower grating elements, and the respective grating periods of the lower grating elements may be progressively increased. After passing through the lower grating elements, the light emitted by or reflected off from the bio-sample may be divided into several lights with different spectrum distribution, and thus the biosensor may obtain much more detailed information of the bio-sample and the difference between various bio-samples may be readily differentiated. Furthermore, when an excitation light is used for irradiating a bio-sample (e.g., through a waveguide), the upper grating elements with a specific grating period may partially block the excitation light to avoid interference in detection.

FIGS. 1A-1B are cross-sectional diagrams of a biosensor 10 in accordance with some embodiments of the disclosure, and FIG. 1C is a top-view diagram of the biosensor 10 in accordance with some embodiments of the disclosure. Referring to FIG. 1A, the biosensor 10 includes a plurality of sensor units 100A and 100B. Each of the sensor unit 100A and the sensor unit 100B includes one or more photodiodes 104, a first aperture feature 108, an interlayer 106, a second aperture feature 110, and a waveguide 112. Although only one photodiode 104 is included in each of the sensor unit 100A and the sensor unit 100B as shown in FIGS. 1A-1B, the number of photodiodes 104 in each sensor unit is not limited thereto. In other embodiments shown in the following figures, each sensor unit may include more than one photodiode 104.

The photodiodes 104 are disposed in a substrate 102. In some embodiments, the substrate 102 may be a semiconductor substrate, for example, a silicon substrate. Furthermore, in some embodiments, the semiconductor substrate may also be an elemental semiconductor including germanium, a compound semiconductor including gallium nitride (GaN), silicon carbide (SiC), gallium arsenide (GaAs), gallium phosphide (GaP), indium phosphide (InP), indium arsenide (InAs), and/or indium antimonide (InSb), an alloy semiconductor including silicon germanium (SiGe) alloy, gallium arsenide phosphide (GaAsP) alloy, aluminum indium arsenide (AlInAs) alloy, aluminum gallium arsenide (AlGaAs) alloy, gallium indium arsenide (GaInAs) alloy, gallium indium phosphide (GaInP) alloy, and/or gallium indium arsenide phosphide (GaInAsP) alloy, or combinations thereof.

The photodiodes 104 may be configured to detect light reflected off from or emitted by an object or a bio-sample. The photodiodes 104 may convert measured light into current signals, and may be connected to a source and a drain of a metal-oxide-semiconductor (MOS) transistor (not shown) that may transfer the current to another component, such as another MOS transistor. That other component may include, but is not limited to, a reset transistor, a current source follower, or a row selector for transforming the current into digital signals.

In some embodiments, the interlayer 106 is disposed on the substrate 102 and the photodiodes 104. The interlayer 106 may include a dielectric material, a semiconductor material, any other suitable material, or a combination thereof. For example, the dielectric material may include silicon oxide (SiO), silicon nitride (SiN), silicon oxynitride (SiON), silicon oxycaribde (SiCO), silicon carbonitride (SiCN), silicon carboxynitride (SiOCN), or a combination thereof. For example, the semiconductor material may include silicon, silicon carbide, any suitable semiconductor material, or a combination thereof. In other embodiments, the interlayer 106 may include an organic material or a polymer material. For example, the organic material or the polymer material may include photoresist, benzocyclobutene (BCB), polyamide, polymethyl methacrylate (PMMA), or a combination thereof.

In some embodiments, the interlayer 106 may be transparent. More specifically, the material of the interlayer 106 may have a light transmittance of greater than 90%, or preferably greater than 95% to light at wavelengths in a range from 200 nm to 1100 nm. The interlayer 106 may be formed using suitable deposition techniques, such as a spin-on coating process, chemical vapor deposition (CVD), physical vapor deposition (PVD), atomic layer deposition (ALD), other suitable deposition methods, or a combination thereof.

The first aperture feature 108 is disposed above the photodiodes 104, and is also disposed on the interlayer 106. The first aperture feature 108 of each of the sensor unit 100A and the sensor unit 100B includes one or more lower grating elements 108A and 108B, respectively. As shown in FIG. 1A, each of the lower grating elements 108A and 108B corresponds to one photodiode 104. In the embodiments where the sensor unit 100A or sensor unit 100B includes more than one lower grating element 108A or 108B and more than one photodiode 104, each of the lower grating elements 108A and lower grating elements 108B may also correspond to one photodiode 104.

The interlayer 106 is also disposed on the first aperture feature 108, and the second aperture feature 110 is disposed on the interlayer 106 such that a portion of the interlayer 106 is sandwiched between the first aperture feature 108 and the second aperture feature 110. The second aperture feature 110 of each of the sensor unit 100A and sensor unit 100B includes an upper grating element 110A and an upper grating element 110B, respectively. Similarly, the upper grating element 110A of the sensor unit 100A and the upper grating element 110B of the sensor unit 100B each correspond to one photodiode 104. In the embodiments where the sensor unit 100A and sensor unit 100B includes more than one photodiode 104, such as 2, 4, or more photodiodes 104, the upper grating element 110A of the sensor unit 100A and the upper grating element 110B of the sensor unit 100B may each correspond to 2, 4 or more photodiodes 104 in the sensor units 100A and 100B.

In some embodiments, the grating period of the lower grating element 108A is the same as the grating period of the lower grating element 108B, and the grating period of the upper grating element 110A is the same as the grating period of the upper grating element 110B. However, in other embodiments, the grating period of the lower grating element 108A is different from the grating period of the lower grating element 108B, and the grating period of the upper grating element 110A is different from the grating period of the upper grating element 110B.

In addition, the grating period of the upper grating elements 110A and 110B is less than or equal to the grating period of the lower grating elements 108A and 108B. In the embodiments where the sensor units 100A and 100B respectively have more than one lower grating element 108A and 108B, the grating period of the upper grating elements 110A and 110B is less than or equal to the grating period of all lower grating elements 108A and 108B. However, in each of the sensor units 100A and 100B, respective lower grating elements may have the same grating period or different grating periods.

The upper grating elements 110A and 110B may have a specific grating period to allow light with a specific wavelength to pass through. When a sample is irradiated using an excitation light, the upper grating elements 110A and 110B may partially block the excitation light from passing through the upper grating elements 110A and 110B. Furthermore, the lower grating elements 108A and 108B may have a grating period that is greater than or equal to that of the upper grating elements 110A and 110B to further block the remaining excitation light and screen a specific spectrum of the light emitted by or reflected off from the sample.

In general, when the lower grating elements 108A and 108B are designed to have a greater grating period than the upper grating elements 110A and 110B, only the incident light with a longer wavelength may pass through the lower grating elements 108A and 108B. Therefore, spectrum selectivity may be achieved.

Moreover, both the lower grating element 108A and the upper grating element 110A in the sensor unit 100A have a first polarizing angle, and both the lower grating element 108B and the upper grating element 110B in the sensor unit 100B that is adjacent to the sensor unit 100A have a second polarizing angle. As shown in FIG. 1A, the first polarizing angle of the lower grating element 108A and the upper grating element 110A and the second polarizing angle of the lower grating element 108B and the upper grating element 110B are different from each other. More specifically, the lower grating element and the upper grating element in any adjacent two sensor units (such as sensor units 100A and 100B shown in the top view of FIG. 1C) have different polarizing angles.

The term "polarizing angle" used herein means that the light polarizing at an angle of 90° or 270° shift to the polarizing angle cannot pass through the upper grating element or the lower grating element having this polarizing angle. The difference of the absolute values between the first polarizing angle and the second polarizing angle may be greater than 0° and less than 180°, such as 0°, 45°, 90°, 135°, or 180°. In some specific embodiments, the difference of the absolute values between the first polarizing angle and the second polarizing angle is 90°. In this case, the polarizing orientation of the light passing through the lower grating element 108A and the upper grating element 110A of the sensor unit 100A is perpendicular to the polarizing orientation of the light passing through the lower grating element 108B and the upper grating element 110B of the sensor unit 100B. Since the polarizing angles of the lower grating element and the upper grating element in any adjacent two sensor units are different, crosstalk between adjacent sensor units may be reduced, and each sensor unit may detect light signals from an object or a bio-sample with high fidelity accordingly.

In some embodiments, the lower grating elements 108A and 108B may have a circular shape, a rectangular shape, a square shape, or a hexagonal shape from a top view of the sensor unit 100A and the sensor unit 100B. In some embodiments, the upper grating elements 110A and 110B may have a circular shape, a rectangular shape, a square shape, or a hexagonal shape from a top view of the sensor unit 100A and the sensor unit 100B. In the embodiments where the sensor units 100A and 100B respectively have more than one lower grating element 108A and more than one lower grating element 108B, the lower grating elements 108A and 108B may collectively have a circular shape, a rectangular shape, a square shape, or a hexagonal shape from a top view of the sensor unit 100A and the sensor unit 100B. Furthermore, in some embodiments, in a top view of the biosensor 10, the lower grating elements 108A and 108B may form a nano-slit array, and the upper grating elements 110A and 110B may also form a nano-slit array (not shown).

The material of the first aperture feature 108 and the second aperture feature 110 may include a metal material, a semiconductor material, or a combination thereof. For example, the metal material may include Al, Cu, Au, Ag, W, Ti, or alloy thereof, and the semiconductor material may include SiC. The material of the first aperture feature 108 and the second aperture feature 110 may be the same or different from each other. In some embodiments, the thickness of the first aperture feature 108 is in a range between about 25 nm and about 500 nm, and preferably between about 50 nm and about 250 nm. In some embodiments, the thickness of the second aperture feature 110 is in a range between about 25 nm and about 500 nm, and preferably between about 50 nm and about 250 nm.

According to other embodiments of the disclosure, the first aperture feature 108 and the second aperture feature 110 may each include a stack of metal-insulator-metal layers. The metal layer may include any aforementioned metal, and the insulator layer may include $SiO_2$, $Al_2O_3$, or a combination thereof. Each metal layer of the stack of metal-insulator-metal layers may have a thickness of about 20 nm to about 150 nm, such as about 40 nm. The insulator layer of the stack of metal-insulator-metal layers may have a thickness of about 60 nm to about 200 nm, such as about 100 nm. The overall thickness of the stack of metal-insulator-metal layers is in a range between about 100 nm and about 500 nm, and preferably between about 100 nm and about 300 nm.

A patterning process may be performed respectively to the first aperture feature 108 and the second aperture feature 110 to form grating elements with desired grating periods and polarizing angles. The patterning process may include a photolithography process and an etching process. In some embodiments, the photolithography process may include photoresist coating, soft baking, hard baking, mask aligning, exposure, post-exposure baking, developing the photoresist, rinsing, drying, or other suitable processes. In some embodiments, the etching process may include a dry etching process, such as plasma etching (PE), reactive ion etching (RIE), inductively coupled plasma reactive ion etching (ICP-RIE), or combinations thereof. As stated above, the lower grating elements 108A, 108B and the upper grating elements 110A, 110B may respectively have specific grating periods depending on design requirement, but the grating period of the lower grating elements 108A and 108B is greater than or equal to the grating period of the upper grating elements 110A and 110B.

In some embodiments, the interlayer 106 disposed between the first aperture feature 108 and the second aperture feature 110 may include a color filter. For example, the color filter may be a rejection filter that may further filter the excitation light from entering the photodiode 104. In other embodiments, the color filter may also include an absorption filter, an interference filter, a plasmonic metasurface structure, a dielectric metasurface structure, or a combination thereof. The color filter may be a single-layered structure or a multi-layered structure.

In some specific embodiments, the color filter is an angle-sensitive filter. When an incident light enters the angle-sensitive filter at a larger angle of incidence, the equivalent wavelength of the incident light that is perpendicular to the angle-sensitive filter will decrease, thereby leading to a blue-shift in spectrum of the incident light. The angle-sensitive may be a dielectric interference filter that is formed by alternately depositing dielectric materials with high and low refractive indices. If the refractive index is greater than about 1.7 at the visible light wavelength range, the refractive index is considered a high refractive index. The dielectric materials with a high refractive index may include $Nb_2O_5$, $Ta_2O_5$, $TiO_2$, $Si_3N_4$, $Al_2O_3$, SiH, or a combination thereof. If the refractive index is smaller than about 1.7 at the visible light wavelength range, the refractive index is considered a low refractive index. The dielectric materials with a low refractive index may include $SiO_2$ $Al_2O_3$, organic polymer, air, or a combination thereof. Alternatively, the angle-sensitive filter may be a plasmonic filter or a dielectric metasurface structure.

In addition, in some embodiments, at least one lens may be disposed in the interlayer 106 that is between the first aperture feature 108 and the second aperture feature 110. The emission light or the reflected light from the sample is focused by the lens such that the emission light or the reflected light after passing through several layers may still retain sufficient light intensity for detection.

Referring to FIG. 1A, an interlayer 106 may also be disposed on the second aperture feature 110, and the waveguide 112 is disposed above the second aperture feature 110 and the interlayer 106. Light emitted from a light source (not shown) may propagate through the waveguide 112 toward the location where the sample is placed or fixed. The waveguide 112 may be a linear waveguide or a planar waveguide.

As shown in FIG. 1A, according to some embodiments of the disclosure, each of the sensor unit 100A and the sensor unit 100B of the biosensor 10 may further include a platen layer 114 disposed above the waveguide 114. The platen layer 114 may provide a flat surface for biometric identification, such as detection of fingerprints or the contour of an object.

In some embodiments, the platen layer 114 may be transparent or semi-transparent. More specifically, in the embodiments where the platen layer 114 is transparent, the material of the platen layer 114 may have a light transmittance of greater than 85%, or preferably greater than 92% to light at wavelengths in a range from 400 nm to 750 nm. In the embodiments where the platen layer 114 is semi-transparent, the material of the platen layer 114 may have a light transmittance of greater than 25% and less than 85% to light at wavelengths in a range from 400 nm to 750 nm.

The material of the platen layer 114 may include silicon oxide ($SiO_2$), amorphous silicon (a-Si), aluminum oxide ($Al_2O_3$), niobium oxide ($Nb_2O_5$), polymer, or a combination thereof. For example, the polymer may include, but is not limited to, bisbenzocyclobutene (BCB), polyimide (PI), polymethylmethacrylate (PMMA), cycloolefin polymer (COP), polycarbonate (PC), another suitable material, or a combination thereof. The platen layer 114 may be formed using sputtering, evaporation, spin-coating, chemical vapor deposition (CVD), molecular beam deposition, any other suitable process or a combination thereof. For example, the chemical vapor deposition process may include low-pressure chemical vapor deposition (LPCVD), low-temperature chemical vapor deposition (LTCVD), rapid thermal chemical vapor deposition (RTCVD), plasma enhanced chemical vapor deposition (PECVD), atomic layer deposition (ALD), or a combination thereof.

In some embodiments, a portion of the surface of the platen layer 114 may be modified so that only the modified portion can capture the desired bio-samples. For example, some desired bio-samples may be captured by modifying some of the functional groups on the surface of the platen layer 114. In addition, the above modified portion of the surface of the platen layer 114 may be further modified to enhance bio-sample immobilization. For example, in some embodiments, the platen layer 114 may be coated or treated with self-assembly monolayers (SAMs), functional polymers, or hydrogels for bio-sample immobilization on the specific locations for detection. Bio-samples may be immobilized on the platen layer 114 depending on their weight, size, surface charge, or van der Waals force and so on.

Referring to FIG. 1B, each of the sensor unit 100A and sensor unit 100B of the biosensor 10 has a nanowell 116 formed in the platen layer 114. A bio-sample to-be-detected may be received in the nanowell 116. The nanowells 116 may be formed by forming openings in the platen layer 114 after depositing the platen layer 114. Similarly, the surface of the nanowells 116 may be modified using similar methods as stated above to enhance the bio-sample immobilization.

Next, referring to FIG. 1C, FIG. 1C illustrates a top-view diagram of the biosensor 10 shown in FIG. 1B. It should be noted that, in FIG. 1B and the top-view diagrams of the following figures, the layers or elements above the first aperture feature 108 are omitted merely for simplicity, except for nanowells 116. In some embodiments, the nanowells 116 may be disposed at the center of symmetry of each of sensor units 100A and 100B. However, in other embodiments, the nanowells may be offset from the center of symmetry of each of sensor units 100A and 100B.

FIG. 2 illustrates top-view diagrams of the sensor units 100A with more than one lower grating element 108A in accordance with other embodiments of the disclosure. As noted above, the first aperture feature 108 of the sensor unit 100A may include more than one lower grating element 108A that defines an m×n grating array, in which m and n are positive integers that can be the same or different. For example, on the left side of FIG. 2, the first aperture feature 108 of the sensor unit 100A includes 9 lower grating elements 108A that define a 3×3 grating array. On the right side of FIG. 2, the first aperture feature 108 of the sensor unit 100A includes 16 lower grating elements 108A that define a 4×4 grating array. In addition, the nanowell 116 may be located at the center of symmetry of the grating array defined by the lower grating elements 108A. Although all lower grating elements 108A are shown to have the same grating period in FIG. 2, it may be appreciated that each sensor unit 100A may include several lower grating elements that has different grating periods.

Although the lower grating elements 108A is illustrated to have the same grating period in FIG. 2, it should be noted that lower grating elements 108A may have respective grating period that may be the same or different, which will be described in detail in the following.

FIGS. 3A-3D are transmission spectrums of light passing through the lower grating elements or upper grating elements respectively made of Al, Cu, Au, and Ag and having various grating periods. As shown in FIGS. 3A-3D, the upper or lower grating elements with a greater grating period may allow the incident light with a longer wavelength to pass through and block the incident light with a shorter wavelength. For example, in FIG. 3A, an incident light with a wavelength of greater than 500 nm may have a light transmittance of greater than 80%, and is able to pass through a lower or upper grating element with a grating period of 250 nm. When using a lower or upper grating element with a grating period of 400 nm, only the incident light with a wavelength greater than 600 nm may pass through the lower or upper grating element. Additionally, different materials may also result in different spectrum selectivity. Therefore, a desired spectrum selectivity may be achieved by selecting a suitable material as well as adjusting the grating period of the lower and upper grating elements.

FIGS. 4A and 4B illustrate a cross-sectional diagram and a top-view diagram of a biosensor 20 in accordance with other embodiments of the disclosure, respectively. As shown in FIGS. 4A and 4B, the sensor units 100A and 100B have two lower grating elements 108A1, 108A2 and 108B1, 108B2, respectively. Two lower grating elements define a 1×2 grating array in one sensor unit. For example, the lower grating elements 108A1 and 108A2 define a 1×2 grating array in the sensor unit 100A, and the lower grating elements 108B1 and 108B2 define a 1×2 grating array in the sensor unit 100B.

In these embodiments, the grating period of the lower grating element 108A1 is less than the grating period of the lower grating element 108A2, and the grating period of the lower grating element 108B1 is less than the grating period of the lower grating element 108B2. The grating period of the upper grating element 110A is less than or equal to the grating period of the lower grating element 108A1, and the grating period of the upper grating element 110B is less than or equal to the grating period of the lower grating element 108B1. Each lower grating element corresponds to one photodiode 104. The emission light or the reflected light from bio-samples passing through the two lower grating elements 108A1, 108A2 or 108B1, 108B2 in each of the sensor units 100A and 100B may be divided into two parts with two types of spectrum distribution, and each part may be detected by one photodiode 104. Therefore, more information may be obtained from the emission light or reflected light traveling in the individual sensor unit.

In addition, the upper grating element 110A and the lower grating elements 108A1, 108A2 in the sensor unit 100A have a first polarizing angle that is different from a second polarizing angle of the upper grating element 110B and the lower grating elements 108B1, 108B2 in the sensor unit 100B. Crosstalk between the adjacent sensor units 100A and 100B may be reduced accordingly. In some specific embodiments, the difference of the absolute values between the first polarizing angle and the second polarizing angle is 90°.

Figures 4C, 4D:
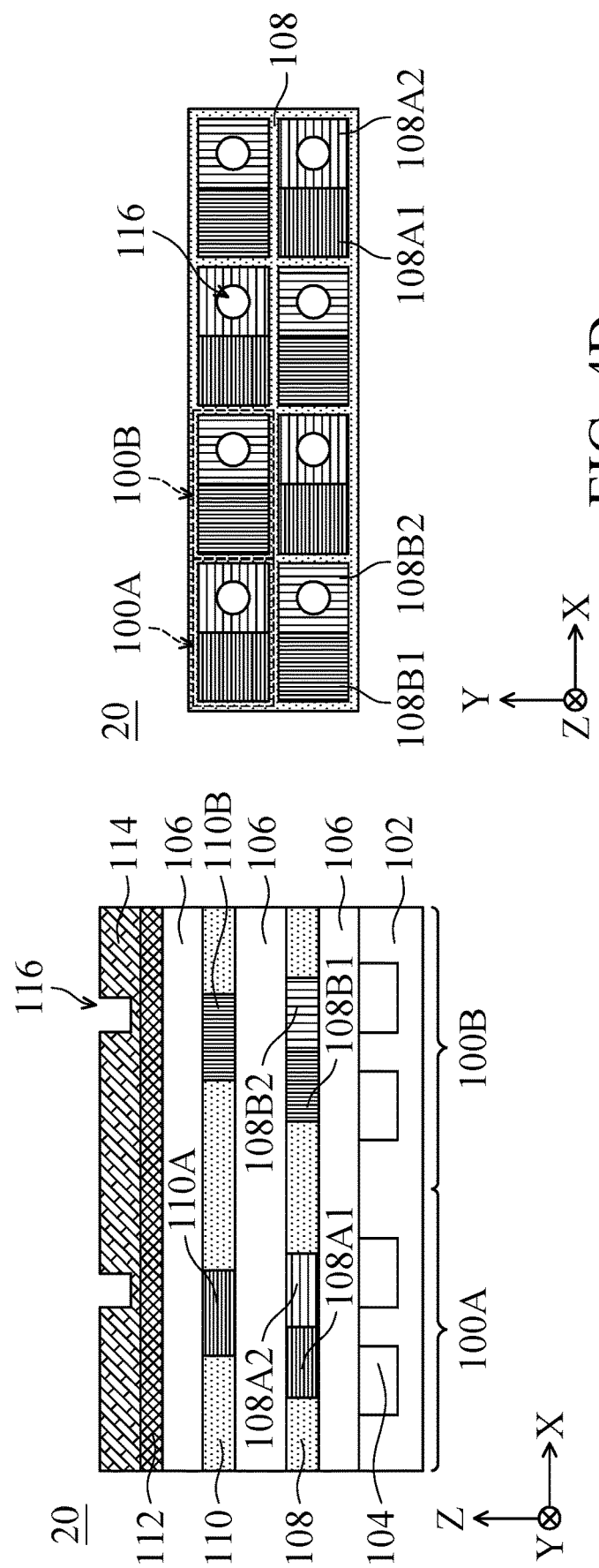
FIGS. 4C-4D illustrate a cross-sectional diagram and a top-view diagram of a biosensor having offset nanowells in accordance with other embodiments of the disclosure, respectively.

Referring to FIGS. 4C and 4D, FIGS. 4C and 4D respectively illustrate a cross-sectional diagram and a top-view diagram of the biosensor 20 having offset nanowells 116 in accordance with other embodiments of the disclosure. In the embodiments shown in FIGS. 4C and 4D, the interlayer 106 between the first aperture feature 108 and the second aperture feature 110 includes an angle-sensitive filter. The nanowell 116 of each of the sensor units 100A and 100B is offset from the center of symmetry of the respective grating arrays defined by the lower grating elements 108A1, 108A2 and 108B1, 108B2. Moreover, the nanowell 116 is located closer to the lower grating element 108A2 or 108B2 that has a smaller grating period than the lower grating element 108A1 or 108B1.

Figure 4E:
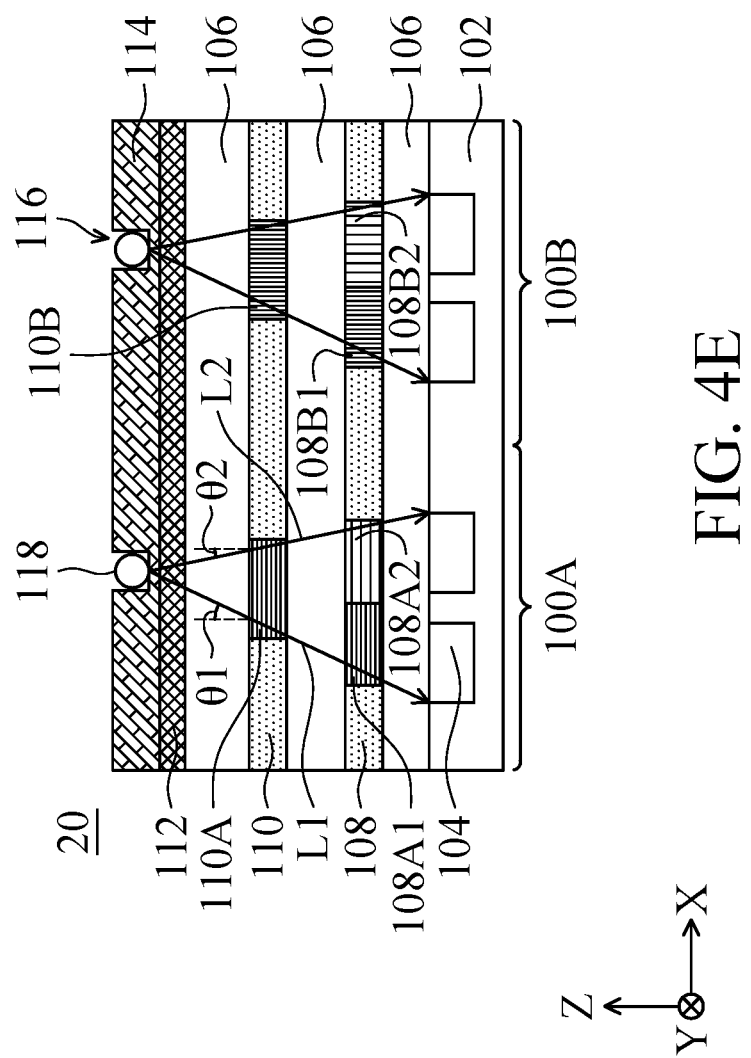
FIG. 4E illustrates the detection of a bio-sample using the biosensor provided by the embodiments shown in FIGS. 4C and 4D.

FIG. 4E illustrates the detection of a bio-sample 118 using the biosensor 20 shown in FIGS. 4C and 4D. By irradiating the bio-sample 118 with the light transmitted through the waveguide 112, the bio-sample 118 may generate an emission light or reflect the light. A first portion L1 of the emission light or the reflected light enters the upper grating element 110A at a first angle θ1 (i.e., enters the lower grating element 108A1 at the first angle θ1), and a second portion L2 of the emission light or the reflected light enters the upper grating element 110A at a second angle θ2 (i.e., enters the lower grating element 108A2 at the second angle θ2). The first angle θ1 is greater than the second angle θ2 since the nanowell 116 is offset from the center of symmetry of the grating array of the sensor unit 100A and is closer to the lower grating element 108A2.

After passing through the angle-sensitive filter in the interlayer 106 between the first aperture feature 108 and the second aperture feature 110, the first portion L1 of the emission light or the reflected light will have a shorter wavelength due to blue-shift effect caused by the angle-sensitive filter. Consequently, a lower grating element with a smaller grating period is required for spectrum selection, such as the lower grating element 108A1 in the sensor unit 100A and the lower grating element 108B1 in the sensor unit 100B. On the other hand, after passing through the angle-sensitive filter, the second portion L2 of the emission light or the reflected light has a longer wavelength than the first portion L1. Thus, a lower grating element with a greater grating period is required, such as the lower grating element 108A2 in the sensor unit 100A and the lower grating element 108B2 in the sensor unit 100B.

Figure 4F:
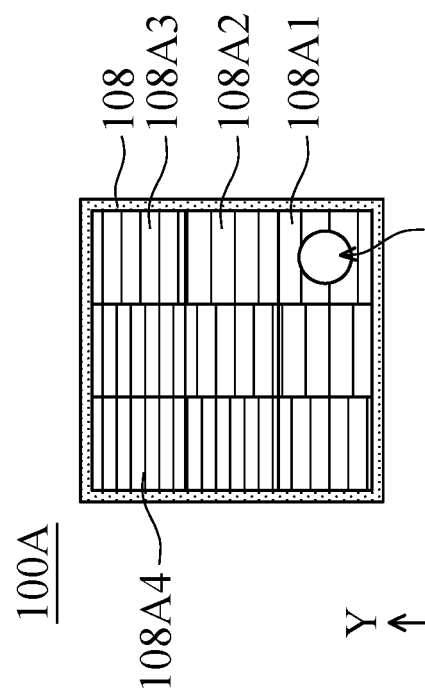
FIGS. 4F-4H are top-view diagrams illustrating sensor units including lower grating elements with various arrangements.
Figure 4G:
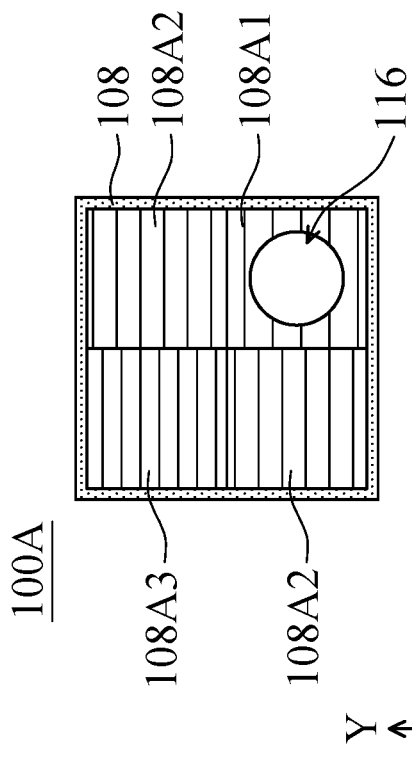
Figure 4H:
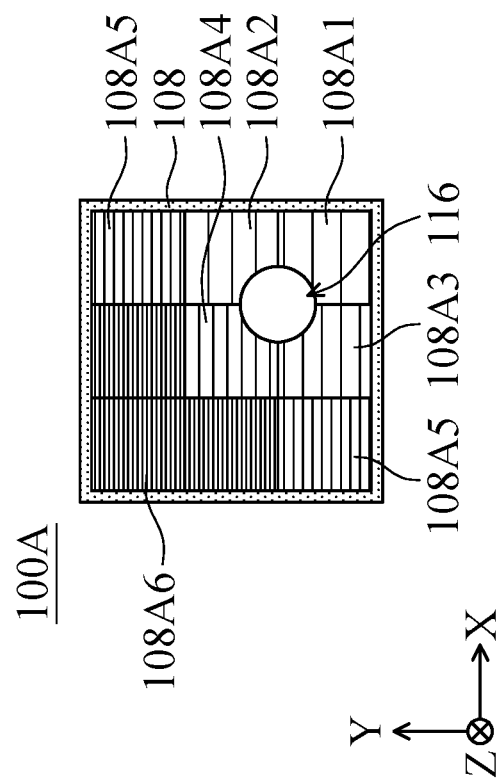

FIGS. 4F-4H are top-view diagrams illustrating the sensor unit 100A including lower grating elements with various arrangements. The sensor unit 100A in FIGS. 4F-4H is similar to the sensor unit 100A in the embodiment shown in FIG. 4D, except that the sensor unit 100A in FIG. 4F has four lower grating elements that define a 2×2 grating array, and the sensor unit 100A in FIGS. 4G and 4H has nine lower grating elements that define a 3×3 grating array.

In the embodiments where the sensor unit 100A includes more than one lower grating element, the grating period of each of the lower grating elements decreases as the lateral distance between the lower grating elements and the nanowell 116 increases. The lateral distance used herein may be a horizontal distance between the lower grating elements and the nanowell 116 along the X direction or the Y direction. In FIG. 4F, the sensor unit 100A has one lower grating element 108A1, two lower grating elements 108A2, and one lower grating element 108A3. The grating period of the lower grating element 108A3 is less than the grating period of the lower grating elements 108A2, and the grating period of the lower grating elements 108A2 is less than the grating period of the lower grating elements 108A1.

The emission light or the reflected light entering the lower grating elements at a greater incident angle may have weaker light intensity. Therefore, as the lateral distance between the lower grating elements and the nanowell 116 increases, more lower grating elements with a smaller grating period are required to obtain enough light intensity for analysis. For example, in FIG. 4G, the sensor unit 100A includes 3 lower grating elements 108A4, 3 lower grating elements 108A3, 2 lower grating elements 108A2, and one lower grating element 108A1. Among all lower grating elements, the lower grating element 108A4 is the farthest from the nanowell 116, and thus has the smallest grating period. In contrast, the lower grating element 108A1 is the closest to the nanowell 116, and thus has the largest grating period.

In FIG. 4H, the sensor unit 100A includes 3 lower grating elements 108A6, two lower grating elements 108A5, one lower grating element 108A4, one lower grating element 108A3, one lower grating element 108A2, and one lower grating element 108A4. In the embodiments shown in FIG. 4H, the nanowell 116 is disposed at the center of a grating array defined by the lower grating elements 108A1, 108A2, 108A3, and 108A4. The lower grating elements 108A1-108A4 have respective grating periods different from one another. Likewise, the lower grating elements 108A that is the farthest from the nanowell 116 has a smallest grating period, and the lower grating elements 108A5 that are closer to the nanowell 116 than the lower grating elements 108A6 have a greater grating period than the lower grating elements 108A6. The lower grating elements 108A1-108A4 may be formed to have different grating periods to allow more diverse spectrum selection. In addition, the arrangement of the lower grating elements 108A1-108A4 is not limited to what is shown in FIG. 4H. The lower grating elements 108A1-108A4 may be arbitrarily arranged as long as they are arranged in 2×2 and directly below the nanowell 116.

Figure 5A:
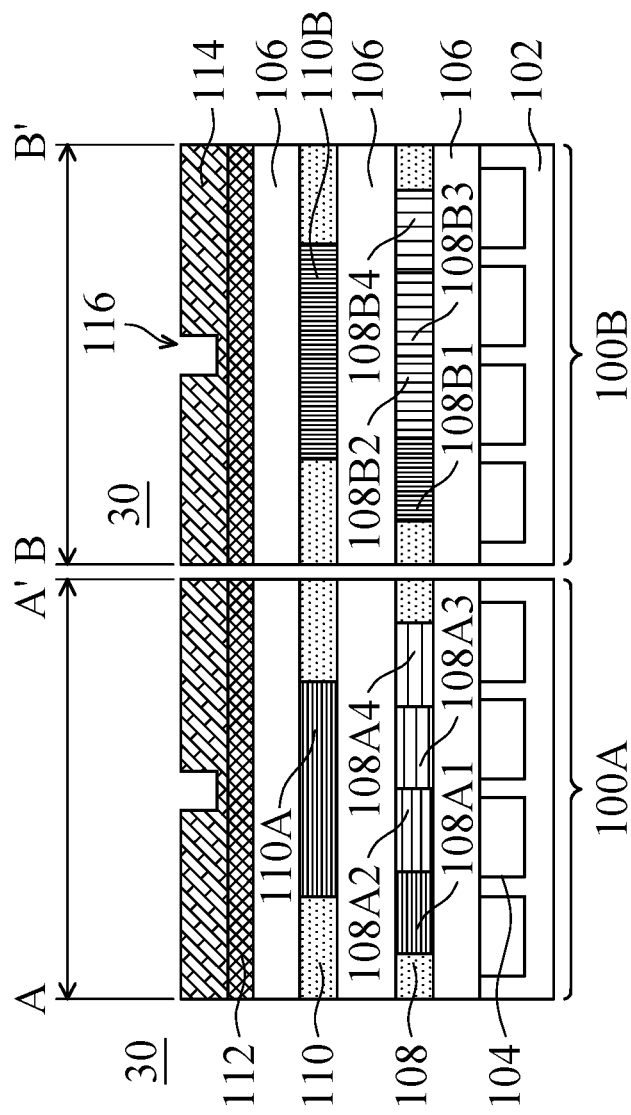
FIGS. 5A-5B illustrate a cross-sectional diagram and a top-view diagram of a biosensor in accordance with other embodiments of the disclosure, respectively.
Figure 5B:
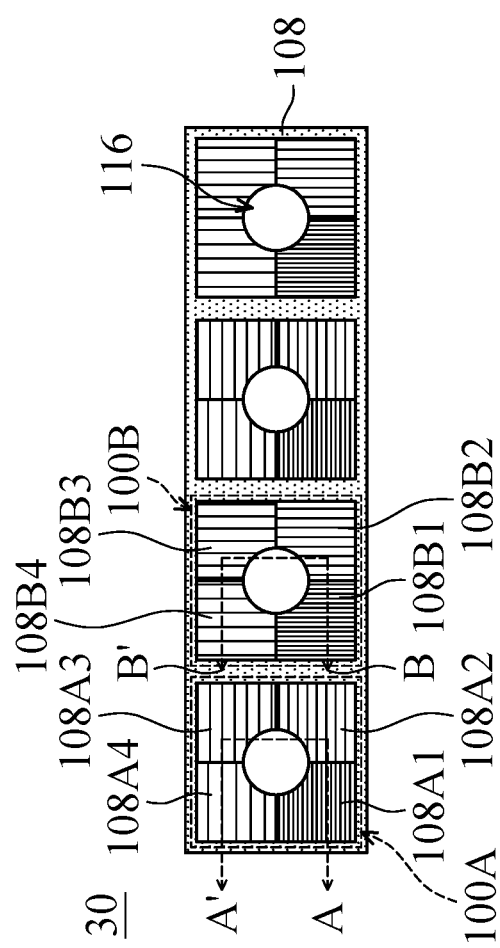

Referring to FIGS. 5A and 5B, FIGS. 5A and 5B illustrate a cross-sectional diagram and a top-view diagram of a biosensor 30 in accordance with other embodiments of the disclosure, respectively. The biosensor 30 shown in FIGS. 5A and 5B is similar to the biosensor 20 shown in FIGS. 4A and 4B, except that each of the sensor units 100A and 100B has four lower grating elements arranged in 2×2. The cross-sections of the sensor unit 100A and the sensor unit 100B of the biosensor 30 are taken along the lines A-A' and B-B', respectively. Although FIG. 5B illustrates how the sensor units 100A and 100B are disposed in an alternating pattern along the X direction, it should be noted that the sensor units 100A and 100B may also be disposed in the same manner but along the Y direction.

In some embodiments, the lower grating elements 108A1-108A4 may have respective grating periods that are progressively increased, and the respective grating periods of the lower grating elements 108A1-108A4 are less than the grating period of the upper grating element 110A. In other embodiments, one or more of the lower grating elements 108A1-108A4 may have the same grating period as the upper grating elements 110A. As stated above, the first polarizing angle of the lower grating elements 108A1-108A4 and the upper grating element 110A in the sensor unit 100A is different from the second polarizing angle of the lower grating elements 108B1-108B4 and the upper grating element 110B in the sensor unit 100B. Additionally, in the embodiments shown in FIGS. 5A and 5B, the nanowell 116 is located at the center of symmetry of a 2×2 grating array that is defined by the lower grating elements 108A1-108A4 or 108B1-108B4.

Although 1, 2, and 4 lower grating elements are shown in the aforementioned figures, it should be appreciated that the number of lower grating elements in each sensor unit is not limited thereto. In other embodiments, each sensor unit may have a plurality of lower grating elements that define an m×n grating array, in which m and n are positive integers that can be the same or different.

In summary, according to some embodiments of the disclosure, each sensor unit of the biosensor may have one upper grating element and one or more lower grating elements. The first polarizing angle of the upper and lower grating elements in one of the sensor units is different from the second polarizing angle of the upper and lower grating element in the adjacent sensor unit. Therefore, crosstalk between adjacent sensor units may be reduced. Furthermore, the lower grating elements may have respective grating periods that are progressively increased and greater than or equal to the grating period of the upper grating element. With such lower grating elements, the biosensor may detect an object or a bio-sample in a precise manner, and the difference between various objects or bio-samples may be readily differentiated.

Although some embodiments of the present disclosure and their advantages have been described in detail, it should be understood that various changes, substitutions and alterations can be made herein without departing from the spirit and scope of the disclosure as defined by the appended claims. For example, it will be readily understood by one of ordinary skill in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A biosensor, comprising:
    a plurality of sensor units,
    wherein each of the sensor units comprises:
        one or more photodiodes;

a first aperture feature disposed above the photodiodes;
an interlayer disposed on the first aperture feature;
a second aperture feature disposed on the interlayer; and
a waveguide disposed above the second aperture feature;
wherein the second aperture feature comprises an upper grating element and the first aperture feature comprises one or more lower grating elements, and a grating period of the upper grating element is less than or equal to a grating period of the one or more lower grating elements; and
wherein a difference of the absolute values between a first polarizing angle of the upper and lower grating elements in one of the sensor units and a second polarizing angle of the upper and lower grating elements in adjacent one of the sensor units is 90°.

2. The biosensor as claimed in claim 1, wherein each of the sensor units further comprises a platen layer disposed above the waveguide.

3. The biosensor as claimed in claim 2, wherein the platen layer is modified to immobilize a bio-sample on the platen layer.

4. The biosensor as claimed in claim 1, wherein a grating array is defined by two or more of the lower grating elements, and respective grating periods of the two or more lower grating elements in the grating array are progressively increased.

5. The biosensor as claimed in claim 2, wherein a nanowell is formed in the platen layer for receiving a bio-sample.

6. The biosensor as claimed in claim 5, wherein the nanowell is located at a center of symmetry of the grating array.

7. The biosensor as claimed in claim 5, wherein the nanowell is offset from a center of symmetry of the grating array.

8. The biosensor as claimed in claim 7, wherein the interlayer comprises an angle-sensitive filter.

9. The biosensor as claimed in claim 5, wherein the grating period each of the lower grating elements decreases as a lateral distance between the lower grating elements and the nanowell increases.

10. The biosensor as claimed in claim 1, wherein each of the one or more lower grating elements corresponds to one of the one or more photodiodes.

11. The biosensor as claimed in claim 1, wherein the first aperture feature or the second aperture feature comprises a stack of metal-insulator-metal layers.

12. The biosensor as claimed in claim 1, wherein at least one lens is disposed in the interlayer.

13. The biosensor as claimed in claim 1, wherein the interlayer comprises a color filter.

14. The biosensor as claimed in claim 13, wherein the color filter has a single-layered structure or a multi-layered structure.

15. The biosensor as claimed in claim 1, wherein the upper grating element has a circular shape, a rectangular shape, a square shape, or a hexagonal shape from a top view.

16. The biosensor as claimed in claim 1, wherein the one or more lower grating elements collectively have a circular shape, a rectangular shape, a square shape, or a hexagonal shape from a top view.

17. A biosensor, comprising:
a plurality of sensor units,
wherein each of the sensor units comprises:
one or more photodiodes;
a first aperture feature disposed above the photodiodes;
an interlayer disposed on the first aperture feature and comprising an angle-sensitive filter;
a second aperture feature disposed on the interlayer; and
a waveguide disposed above the second aperture feature;
and wherein the second aperture feature comprises an upper grating element and the first aperture feature comprises one or more lower grating elements, and a grating period of the upper grating element is less than or equal to a grating period of the one or more lower grating elements.

18. The biosensor as claimed in claim 17, wherein a difference of the absolute values between a first polarizing angle of the upper and lower grating elements in one of the sensor units and a second polarizing angle of the upper and lower grating elements in adjacent one of the sensor units is 90°.

19. The biosensor as claimed in claim 18, wherein each of the sensor units further comprises a platen layer disposed above the waveguide, and a nanowell is formed in the platen layer for receiving a bio-sample.

20. The biosensor as claimed in claim 19, wherein:
a grating array is defined by a first and a second lower grating elements;
the first lower grating element has a first grating period, and the second lower grating element has a second grating period that is greater than the first grating period;
the nanowell is offset from a center of symmetry of the grating array; and
the nanowell is closer to the second lower grating element than the first lower grating element.

* * * * *